United States Patent [19]

Inui et al.

[11] Patent Number: 5,028,579
[45] Date of Patent: Jul. 2, 1991

[54] IMAGE FORMING METHOD

[75] Inventors: Toshiharu Inui, Yokohama; Masanori Takenouchi, Atsugi, both of Japan

[73] Assignee: Canon Kabushiki Kaisha, Tokyo, Japan

[21] Appl. No.: 376,988

[22] Filed: Jul. 7, 1989

[30] Foreign Application Priority Data

Jul. 8, 1988 [JP] Japan ................ 63-168693

[51] Int. Cl.$^5$ ............... B41M 5/30; B41M 5/36; G03C 1/40; G03C 1/00
[52] U.S. Cl. ................... 503/201; 428/195; 428/321.5; 428/913; 428/914; 430/138; 430/200; 503/215
[58] Field of Search .......... 430/138, 200; 503/201, 503/215; 428/195, 321.5, 913, 914

[56] References Cited

U.S. PATENT DOCUMENTS

| | | | |
|---|---|---|---|
| 3,219,446 | 11/1965 | Berman .................. | 96/28 |
| 4,399,209 | 8/1983 | Sanders et al. .......... | 430/138 |
| 4,416,966 | 11/1983 | Sanders et al. .......... | 430/138 |
| 4,602,263 | 7/1986 | Borror et al. ........... | 346/201 |
| 4,624,910 | 11/1986 | Takeda ................. | 430/203 |

FOREIGN PATENT DOCUMENTS

| | | |
|---|---|---|
| 18979 | 8/1959 | Japan . |
| 9672 | 11/1959 | Japan . |
| 8436 | 7/1961 | Japan . |
| 860590 | 2/1961 | United Kingdom . |
| 974837 | 11/1964 | United Kingdom . |

Primary Examiner—Bruce H. Hess
Attorney, Agent, or Firm—Fitzpatrick, Cella, Harper & Scinto

[57] ABSTRACT

An image forming method, comprising: providing a recording medium including a substrate and a transfer recording layer disposed thereon, the transfer recording layer being capable of changing its transfer characteristic when provided with light and heat energies; imparting heat energy to the transfer recording layer and imparting light energy to the transfer recording layer at an elevated temperature under such a condition that at least one of the light and heat energies corresponds to a recording information signal, thereby to form a transferable image in the transfer recording layer; and transferring the transferable image in the transfer recording layer to a transfer-receiving medium wherein at least light energy is imparted to the transfer recording layer prior to the formation of the transferable image.

13 Claims, 10 Drawing Sheets

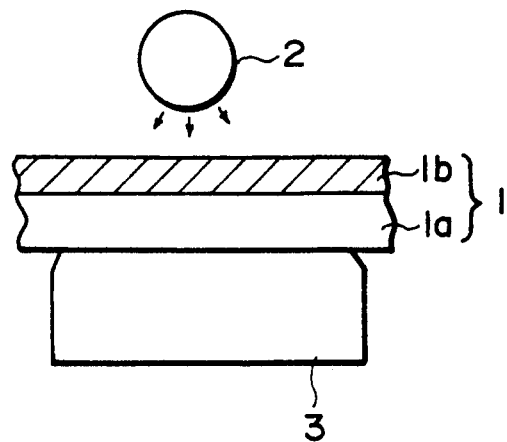
F I G. 2
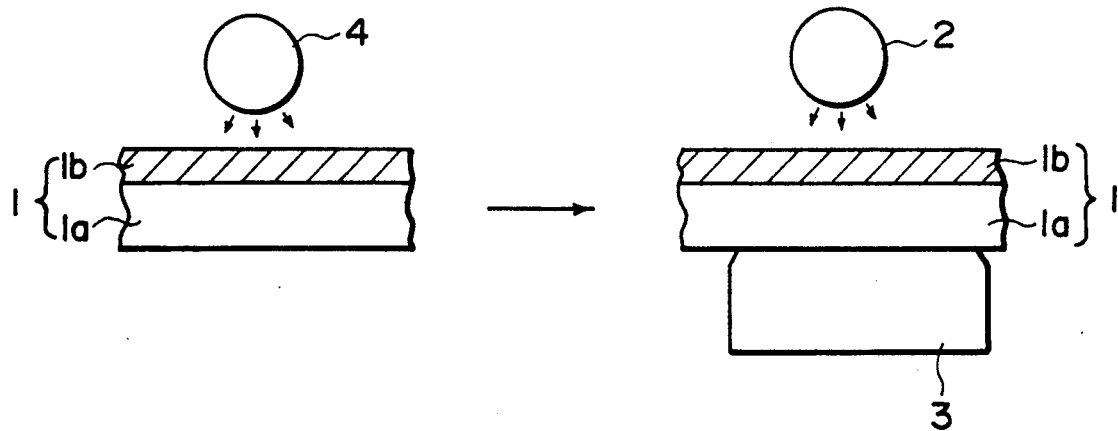
F I G. 3

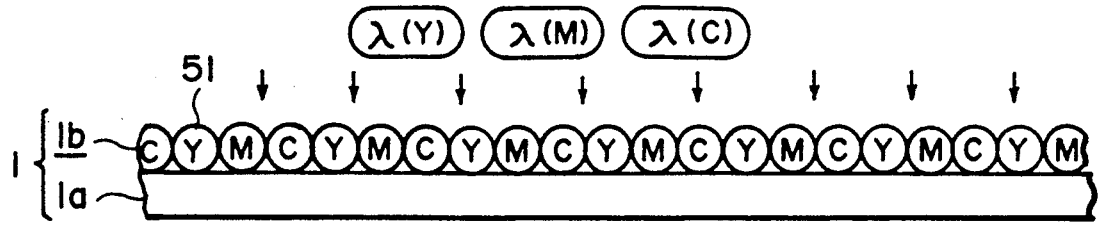
F I G. 4A
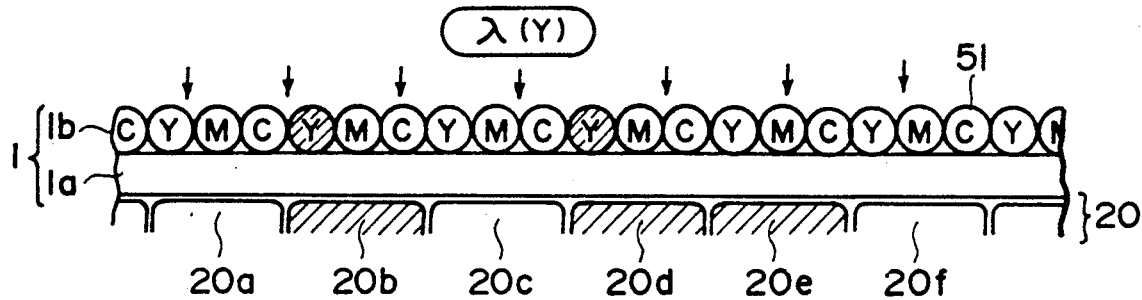
F I G. 4B
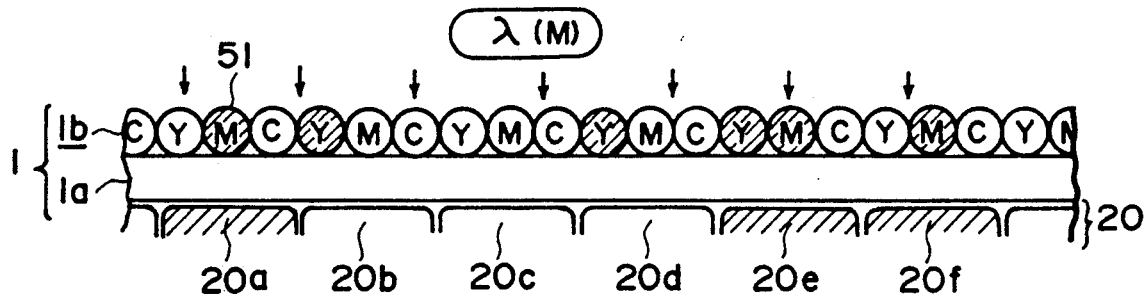
F I G. 4C

IMAGE FORMING METHOD

FIELD OF THE INVENTION AND RELATED ART

The present invention relates to an image forming method capable of forming an image by utilizing light and heat energies.

Hitherto, there have been known various methods of forming an image by utilizing photopolymerization or thermal transfer.

As the methods of forming a plate or an image by photopolymerization, Japanese Patent Publication (JP-B, KOKOKU) Nos. 18979/1962 and 9672/1963 disclose a method wherein a layer of a photopolymerizable composition is disposed on a substrate, which is then exposed patternwise to form an image comprising polymerized and non-polymerized portions, and the image is transferred to another substrate by utilizing the resultant different in adhesion or transferability. Further, Japanese Patent Publication No. 8436/1964 discloses a method wherein a photopolymerizable composition sandwiched between a substrate and a covering sheet is exposed, and then the substrate and the covering sheet are separated to obtain an image.

Further, U.S. Pat. Nos. 3,219,446 and 4,399,209 disclose an image forming method wherein photopolymerization is applied to color recording. U.S. Pat. No. 3,219,446 discloses a copying process for making visible positive prints which uses a record transfer sheet including a rupturable light-sensitive coating which includes microscopic capsules containing a liquid light-polymerizable material. In this method, the transfer sheet is exposed to light through a light-image control device, (and the light-exposed sheet is heated to polymerizing temperature, as desired) placed in contact with a receiving copy sheet, and supplied with sufficient pressure to rupture the capsules, whereby the still-liquid capsule contents are transferred onto the copy sheet as a visible positive print. Further, the process of U.S. Pat. No. 4,399,209 uses a recording medium comprising a substrate paper, and a chromogenic layer applied thereon, and microcapsules of a radiation-curable material randomly disposed on the chromogenic layer which can show each of three primary colors of yellow, magenta and cyan by reacting with the chromogenic layer, and have selectivity to wavelengths. Such recording medium is sequentially subjected to positive exposures corresponding to the primary three colors, and thereafter it is pressed so that the uncured microcapsules are ruptured and react with the chromogenic layer to develop the color, whereby a multi-color image is obtained.

Further, U.S. Pat. No. 4,416,966 discloses a "self-contained" image forming system wherein an image-forming sheet comprising photosensitive microcapsules and a developer both disposed on the same surface of a substrate is used. In this system, the image-forming sheet is exposed mainly to ultraviolet rays exchanged corresponding to an image to be recorded, and then it is passed through pressing rollers so that the microcapsules are ruptured and the internal phase thereof is ejected imagewise. Concurrently, a chromogenic material migrates to the developer ordinarily disposed in another layer and the chromogenic material reacts therewith to form a multicolor image.

On the other hand, the thermal or heat-sensitive transfer recording method has recently been developed with rapid progress in information industry.

The thermal transfer recording method generally employs an ink ribbon comprising a heat-transferable ink containing a colorant dispersed in a heat-fusible binder, which is applied on a support generally in the form of a ribbon, and effects recording on a recording paper. The recording is generally conducted by superposing the ink ribbon on the recording paper so that the heat-transferable ink layer will contact the recording paper while covering the ink ribbon and the recording paper to a portion between a thermal head and a platen, supplying a heat pulse from the support side of the ink ribbon by means of the thermal head corresponding to an image signal while causing the ink ribbon to contact the recording paper to transfer the melted ink to the recording paper, whereby a transferred ink image corresponding to the heat supplying pattern is formed on the recording paper.

The above-mentioned thermal transfer recording method has recently been widely used because it has advantages such that the apparatus employed is light in weight, compact, free of noise, and also has other advantages such that it can effect recording on plain paper.

In each of the above-mentioned image forming methods using photopolymerization, only light energy (mainly of ultraviolet rays) is used for forming a latent image on a recording medium, so that a recording medium highly sensitive to light or a light flux of a high energy is required in order to obtain a clear image at a high speed. A high sensitivity recording medium only utilizing light energy is also sensitive under no application of light, and therefore it has a relatively poor storage stability in the neighborhood of room temperature.

Further, in the above-mentioned method, since only light energy is used for forming a latent image on a transfer recording medium, it is not suitable in a case where an image is outputted depending on an external signal in an apparatus such as a printer, or in a case where image information read from a multicolor original is converted into a digital signal by using a color-image scanner and then imparted to a recording medium. More specifically, a light flux having a shorter wavelength, mainly of ultraviolet rays, is required in order to radiate a light of high energy, but there has not been obtained a light source which can digitally control ultraviolet rays. For example, an optical head such as a liquid crystal shutter array and an LED array has been proposed in order to obtain a digital light source. However, although these heads are suitable for miniaturization, ultraviolet rays cannot stably be obtained thereby because liquid crystal molecules deteriorate in an ultraviolet wavelength region.

Further, the recording medium used in the above-mentioned image forming method disclosed in U.S. Pat. No. 4,399,209; and 4,416,966 utilizes a color-forming reaction of a leuco dye so that the resultant recorded image is essentially inferior in stability.

Further, in the above-mentioned image forming method wherein microcapsules are ruptured to form a color, in order to facilitate the development through pressure-application, the enclosed material in the microcapsules is required to be formed as a photosensitive composition which is liquid at room temperature, and therefore provides a poor storability. Moreover, the resultant image is accompanied with an odor of a monomer because a non-reacted material is ruptured, thus providing a practically undesirable characteristic.

On the other hand, in the conventional thermal transfer recording method, it has been required to repeat plural times of transfer to superpose colors in order to obtain a multi-color image.

Accordingly, there have been attended with difficulties such as provision of plural thermal heads or complex movements involving reversals of direction and stopping of a recording paper, so that it has been difficult to obtain an image free of color deviation or aberration, and the apparatus used therefor undesirably becomes large and complex.

In order to solve the above-mentioned problems, our research group has proposed an image forming method wherein a transfer recording is effected on a transfer-receiving medium such as paper by using plural kinds of energies (U.S. Pat. Application Ser. No. 869,689).

According to this novel image forming method, a high-quality image can be obtained even on a transfer-receiving medium (or medium to be recorded) with low surface smoothness, and a multi-color image can be obtained without complex movement of the transfer-receiving medium.

Further, our research group has proposed a recording method wherein the above-mentioned recording method of U.S. Pat. Application Ser. No. 868,689 is improved in fixing (U.S. Pat. Application Ser. No. 927,876), and a recording method wherein a vaporizable dye is applied to the above recording method (U.S. Pat. Application Ser. No. 070,194) and a recording method using an intermediate transfer medium (U.S. Pat. Application Ser. No. 295,508). Our research group has also proposed several recording media suitably used in the above image forming method in U.S. Pat. Application Ser. Nos. 127,930, 127,948, 128,465, 129,488, 130,555, 131,086 and 228,505, and another image forming method obtained by the application of the above-mentioned image forming method of U.S. Pat. Application Ser. No. 868,689 (U.S. Pat. Application Ser. No. 127,386 and No. 228,505).

Furthermore, our research group has proposed several image forming apparatus suitably used in the image forming method of U.S. Pat. Application Ser. No. 869,689 (U.S. Pat. Application Ser. Nos. 8914; 22,051; 27,219; 41,043; 116,789; etc.).

As described above, the above-mentioned technique of our research group has solved various problems encountered in the prior art and provided a recording method by which a high-quality image can be obtained even on a transfer-receiving medium (or medium to be recorded) with low surface smoothness, and a multi-color image can be obtained without complex movement of the transfer-receiving medium when this technique is applied to multi-color recording. In such a recording method, however, a further improvement in recording speed is still desired.

SUMMARY OF THE INVENTION

An object of the present invention is to provide an image forming method capable of high-speed recording based on an improvement on the above-mentioned technique of our research group.

Another object of the present invention is to provide an image forming method capable of effecting image formation with a lower electric power consumption.

As a result of earnest study, we have found that in a case where a transferable image is formed in a transfer recording layer corresponding to recording information, when light energy is preliminarily imparted to the transfer recording layer prior to the application of two kinds of energies substantially contributing to the above-mentioned transferable image formation, not only the process speed in the transferable image formation step but also that in the whole image formation process is accelerated, while the resultant image quality is not substantially impaired.

The image forming method according to the present invention is based on the above discovery and comprises: providing a recording medium comprising a substrate and a transfer recording layer disposed thereon; the transfer recording layer being capable of changing its transfer characteristic when provided with light and heat energies;

imparting heat energy to the transfer recording layer and imparting light energy to the transfer recording layer at an elevated temperature under such a condition that at least one of the light and heat energies corresponds to a recording information signal, thereby to form a transferable image in the transfer recording layer; and transferring the transferable image in the transfer recording layer to a transfer-receiving medium, thereby to form thereon an image corresponding to the transferable image;

wherein at least light energy is imparted to the transfer recording layer prior to the formation of the transferable image.

In the above-mentioned image forming method according to the present invention, a predetermined quantity of light energy is preliminarily imparted to the transfer recording layer before the application of the two kind of energies substantially contributing to the transferable image formation, whereby a predetermined reaction progresses to some extent such that it does not substantially impair the resultant image quality. As a result, not only the transferable image formation step as a rate-determining step but also the whole image formation process can be accelerated.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS:

FIGS. 2 and 3 are schematic sectional view of a recording medium taken in the thickness direction for illustrating a principle of the image forming method according to the present invention;

DETAILED DESCRIPTION OF THE INVENTION

Figure 1:
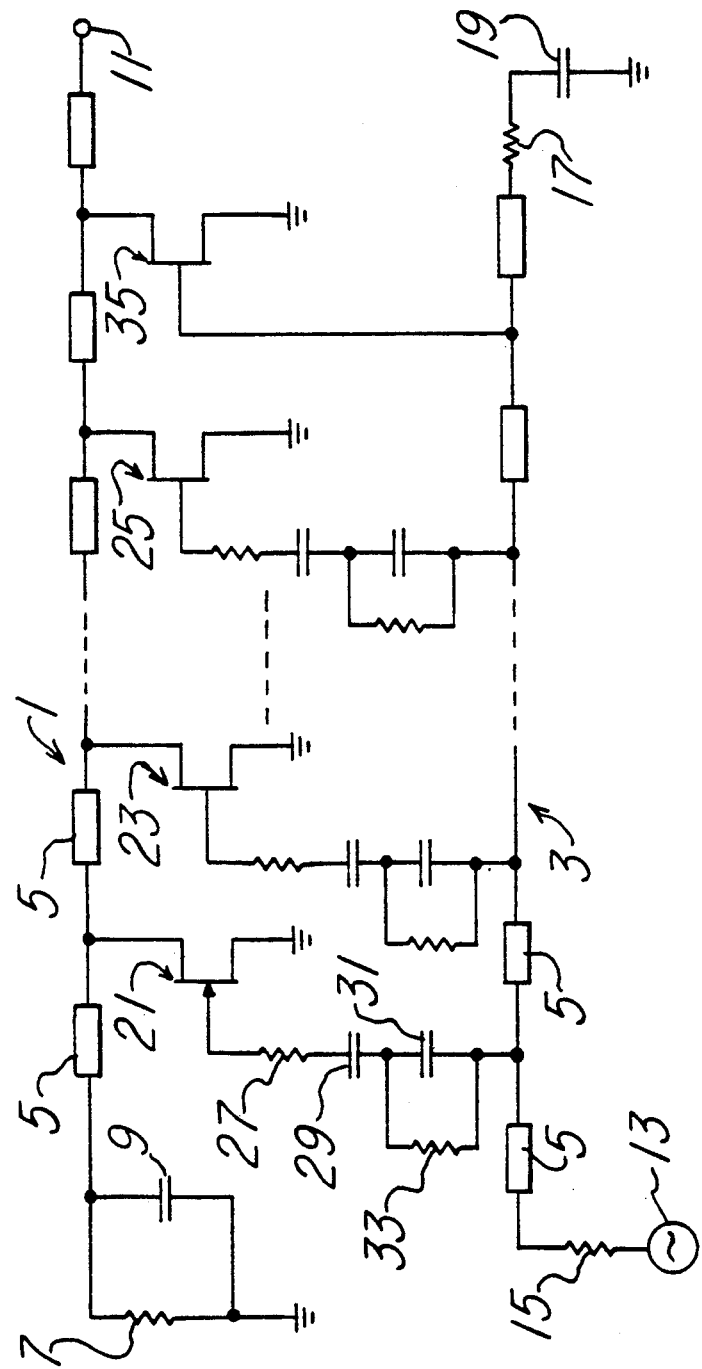
FIG. 1 is a graph for illustrating a principle of the image forming method according to the present invention.

A basic embodiment of the image forming method according to the present invention is described with reference to the graph of FIG. 1 showing an example of change in the transfer characteristic (or transferability) of a transfer recording layer, and the schematic sectional views of FIGS. 2 and 3 each showing a transfer recording medium taken in the thickness direction.

The transfer recording layer constituting the recording medium used in such an embodiment comprises a material sensitive to the application of light and heat, and has a property such that when light and heat energies are imparted thereto, the polymerization of a polymerizing component contained therein abruptly progresses to cause hardening, whereby the transfer characteristic of the transfer recording layer is irreversibly changed.

FIG. 1 is a graph for illustrating such a property. In the first quadrant (i.e., the upper right quadrant) of FIG. 1, the solid line shows a relationship such that the degree (or rate) of polymerization is abruptly increased when light and heat energies are imparted to the transfer recording layer. Further, in the first quadrant of FIG. 1, the broken lines shows an increase in the polymerization degree of the polymerizing component in a case where only light energy is imparted to the transfer recording layer.

Further, in the second quadrant (i.e., the upper left quadrant) of FIG. 1, the graph shows a change in a transfer-initiation temperature (or transfer temperature) of the transfer recording layer which occurs along with the increase in the polymerization degree of the polymerizing component. As described above, in order to reduce the energy consumption in the entire process by utilizing the reduction in heat energy consumption, the transfer recording layer used in the present invention may preferably have a property such that the polymerization degree of the polymerizing component somewhat increases even when only light energy is imparted to the transfer recording layer.

The transfer initiation temperature mentioned herein is a value measured by the following method.

A 6 micron-thick transfer recording layer formed on a 6 micron-thick polyethylene terephthalate (PET) film is caused to contact 0.2 mm-thick wood-free paper as a transfer-receiving medium having a surface smoothness (Bekk smoothness) of 50-200 seconds. The resultant laminate of the transfer recording medium and the paper is passed at a rate of 2.5 mm/sec between a pair of rollers as follows. The first roller is a hollow cylindrical iron roller of 40 mm diameter in which a 300 W-halogen lamp heater is stored and is disposed on the side of the transfer recording medium. The second roller disposed on the side of the paper comprises a similar iron roller of 40 mm diameter coated with a 0.5 mm-thick fluorine rubber layer. The two rollers are operated to exert a linear pressure of 4 kg/cm. In the measurement, the surface temperature of the first roller is measured by a temperature sensor, e.g., a thermistor, while controlling the halogen lamp heater to provide a prescribed temperature. At a time of 4 seconds after the laminate is passed through the two rollers, the transfer recording medium is peeled off the paper moved horizontally at a peeling angle of about 90 degrees and at a rate equal to the conveying speed of the rollers, so that it is observed whether the transfer recording layer has been transferred onto the paper. The operation is continued while gradually raising the surface temperature of the first roller (at a rate of 10° C./min or less), and the minimum temperature at which the transfer starts to occur effectively (as identified by saturation of a transferred image density) is identified as the transfer initiation temperature of the transfer recording medium or the transfer recording layer.

Next, for the purpose of explaining the principle of the image forming method according to the present invention, there is first described a case wherein an energy corresponding to recording information is imparted to a recording medium at one step.

More specifically, e.g., referring to the schematic sectional view of FIG. 2 showing a recording medium 1 taken in the thickness direction, when the recording medium 1 comprising a substrate $1a$ and a transfer recording layer $1b$ disposed thereon is imparted with a heat energy by a heating means 3 for a period of time of from 0 to $t_2$ shown in FIG. 1 and imparted with a light energy by a light illumination means 2 in a state where the transfer recording layer $1b$ is at an elevated temperature, the transfer-initiation temperature $T_0$ of the transfer recording layer $1b$ before the application of the light energy is irreversibly increased to $T_2$, as shown in the graph of FIG. 1. Accordingly, when the two kind of energies (i.e., light and heat energies) are imparted to the transfer recording layer $1b$ under a condition such that at least one of the light and heat energies corresponds to a recording information signal, a transferable image (or transferable portion) corresponding to the recording information is formed in the transfer recording layer $1b$. In the subsequent transfer step, when the recording medium 1 is superposed on a transfer-receiving medium (not shown) such as plain paper so that the transfer recording layer $1b$ contacts the transfer-receiving medium, and a transfer operation is conducted at a temperature T satisfying a relationship of $T_0<T<T_2$, a desired transferred image is provided on the transfer-receiving medium.

In the graph of FIG. 1, $T_1$ represents a temperature at which the transfer-initiation temperature of the transfer recording layer starts an abrupt increase, $N_1$ represents a polymerization degree at which the above-mentioned transfer-initiation temperature becomes $T_1$, $t_1$ represents an illumination time for obtaining the polymerization degree $N_1$, i.e., a minimum light illumination time in which a transferable image is formed due to an abrupt increase in the transfer-initiation temperature.

Next, there is described a case wherein energies are imparted to a transfer recording layer through two steps, as in the image forming method according to the present invention.

More specifically, the first quadrant of FIG. 1 indicates that the polymerization degree of a polymerizing component increases even in the case of the application of light energy alone (broken line). For example, only light energy is imparted for a period of from 0 to $t_3$, the polymerization degree becomes $N_3$. However, as shown in the second quadrant of FIG. 1, the transfer-initiation temperature of a transfer recording layer is at a state at which it does not abruptly change yet, and the transfer-initiation temperature is $T_0$ which is the same as that in the case of a polymerization degree of 0 (zero). When heat energy is imparted to the transfer recording layer in this state (i.e., the polymerization degree of $N_3$) and light energy is imparted thereto at an elevated temperature, only an illumination time of $(t_2-t_3')$ is required in order to harden the polymerizing component to a polymerization degree of $N_2$, which is the same as that in the case described hereinabove.

In other words, the above-mentioned period of time of $(t_2-t_3')$ is shorter than the period of time of $t_2$ in which the polymerization degree is increased from 0 to $N_2$ on the basis of the application of light and heat energies at one step. Accordingly, when the polymerization degree of the transfer recording layer is preliminarily increased to an extent such that the transfer-initiation temperature of the transfer recording layer does not abruptly increase, prior to the formation of a transferable image, the period of time in which light and heat energies are imparted to form the transferable image may be shortened.

FIG. 3 is a schematic sectional view taken in the thickness direction of a transfer recording medium, which shows an embodiment for practicing the above-mentioned two-step energy application. Referring to FIG. 3, light energy is preliminarily imparted to the transfer recording medium 1 by a light illumination means 4 for a period of 0 to $t_3$ as shown in the graph of FIG. 1, prior to the formation of a transferable image, thereby to increase the polymerization degree of a polymerizing component to $N_3$, and thereafter light and heat energies are imparted to the transfer recording medium 1 by a light illumination means 2 and a heating means 3 for a period of $(t_2-t_3')$ as shown in the graph of FIG. 1, thereby to further increase the polymerization degree to $N_2$.

For example, the total quantity of energy (light energy + heat energy) required for increasing the above-mentioned transfer-initiation temperature to 150° C. with respect to unit area (e.g., 1 mm × 1 mm) of a transfer recording layer is represented by A (joule). In the present invention wherein a prescribed quantity of light energy (or light and heat energies) is imparted to the transfer recording layer before the formation of a transferable image (hereinafter, the energy application step prior to the transferable image formation step is referred to as "pre-application step"), it is preferred to impart $0.1 \times A$ to $0.8 \times A$ joule, more preferably $0.2 \times A$ to $0.8 \times A$ joule, (particularly preferable $0.3 \times A$ to $0.7 \times A$ joule) of energy to the unit area of the transfer recording layer.

In the present invention, the ratio (C/B) between the quantity of energy to the imparted to the transfer recording layer in the pre-application step (B joule), and the quantity of energy to be imparted thereto in the image formation step (C joule) may preferably be 0.3 to 20, more preferably 0.3 to 10. If the ratio (C/B) is larger than 20, the amount of change in the polarization degree of a polymerizing component (contained in a portion imparted with the energy) is relatively small, whereby the reduction in energy consumption with respect to the entire process substantially becomes small (C/B) is smaller than 0.3, the polarization degree of the polymerizing component becomes close to $N_1$ (in FIG. 1) in the pre-application step, whereby the quantity of energy to be applied to the transfer recording layer in the transfer step becomes considerably small. As a result, it becomes difficult to control the environmental stability, etc.

In an embodiment of the present invention wherein light and heat energies are imparted to the transfer recording layer in the pre-application step, the total quantity of energies in the pre-application step is defined as the sum of the quantity of the light energy, and the quantity of the heat energy to be imparted to the transfer recording layer in a period of time wherein the light energy is imparted thereto.

As described hereinabove, in the present invention, the transfer recording layer is preliminarily caused to react to a predetermined extent and thereafter a transferable image is formed therein, whereby the period of time required for the formation of the transferable image is shortened, and high-speed recording can be effected.

Next, there is described an embodiment of the present invention wherein a multi-color recording is effected.

A multi-color transfer recording medium 1 according to this embodiment comprises a transfer recording layer 1b disposed on a substrate or base film 1a. The transfer recording layer 1b is formed as a layer of distributed particulate image forming elements 51. Respective image forming elements 51 show different color tones or coloring characteristics. In the embodiment shown in FIGS. 4A–4E, for example, each image forming element 51 contains any one colorant selected from yellow (Y), magenta (M) and cyan (C). The colorants to be contained in the image forming elements 51, however, are not restricted to yellow, magenta and cyan, but may be colorants of any color depending on an intended use. Each image forming element contains, in addition to the colorant, a functional or sensitive component, of which transfer characteristic abruptly changes when light and heat energies are applied thereto. The transfer recording layer 1b as a distributed layer of image forming elements may be formed on the substrate 1a together with a binder or by heat-melting the above image forming elements.

The functional component in the image forming elements 51 has a wavelength dependency depending on the colorant contained therein. More specifically, an image forming element 51 containing a yellow colorant causes abrupt polymerization to be hardened or cured when a heat flux and a light beam with a wavelength $\lambda(Y)$ are applied thereto. Similarly, an image forming element 51 containing a magenta colorant and an image forming element 51 containing a cyan colorant respectively cause polymerization to be hardened when a light beam with a wavelength $\lambda(M)$ and heat, and a light beam with a wavelength $\lambda(C)$ and heat, respectively, are applied thereto. A cured or hardened image forming element 51 does not cause decrease in viscosity even when heated in a subsequent transfer step, so that it is not transferred to a transfer-receiving medium. In the above-mentioned embodiment, at lease one of the heat and light is applied corresponding to an information signal to be recorded.

In a multi-color recording mode of the image forming method according to the present invention, light beams with wavelengths $\lambda(Y)$, $\lambda(M)$ and $\lambda(C)$ is first imparted to the recording medium 1 for a prescribed period of time, as shown in FIG. 4A. In such a case, light sources corresponding to the above-mentioned three kinds of light beams may be turned on simultaneously or in sequence.

Next, referring to FIG. 4B, the transfer recording medium 1 is superposed on a thermal head 20 and light is supplied thereto so as to cover the entire heat generation region of the thermal head 20. The wavelengths of the illumination light are so selected sequentially as to react on image forming elements 51 to be illuminated.

For example, if image forming elements 51 to be illuminated are colored in any one of cyan, magenta and yellow, light beams having a wavelength λ(C), λ(M) and λ(Y), respectively, are successively supplied thereto.

More specifically, while the transfer recording layer 1b side of the transfer recording medium 1 is illuminated with a light beam having a wavelength λ(Y), resistance heating elements 20b, 20b and 20e, for example, of the thermal head 20 are caused to generated heat. As a result, among the image forming element 51 containing a yellow colorant, those applied with the heat and the light beam with a wavelength λ(Y) are cured as shown by hatching in FIG. 4B (in FIGS. 4C, et seq., the cured elements are also indicated by hatching).

Figure 4D:
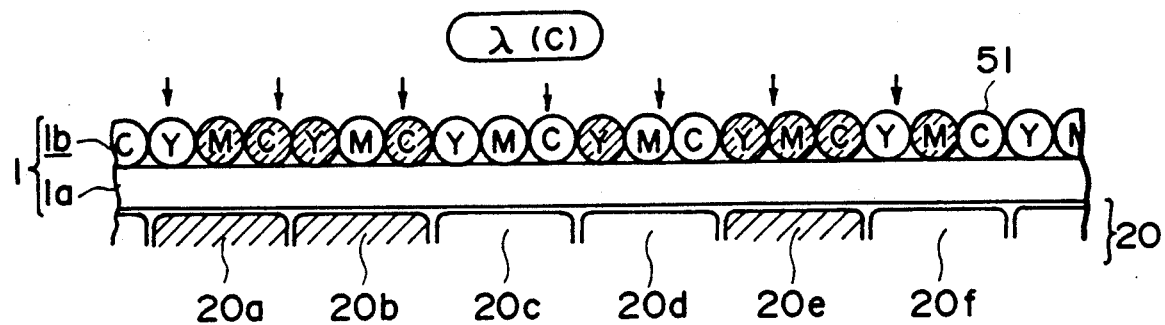
FIG. 4 is a schematic partial sectional view showing a relationship between a transfer recording medium and a thermal head involved in a multi-color recording mode according to the present invention.
Figure 4E:
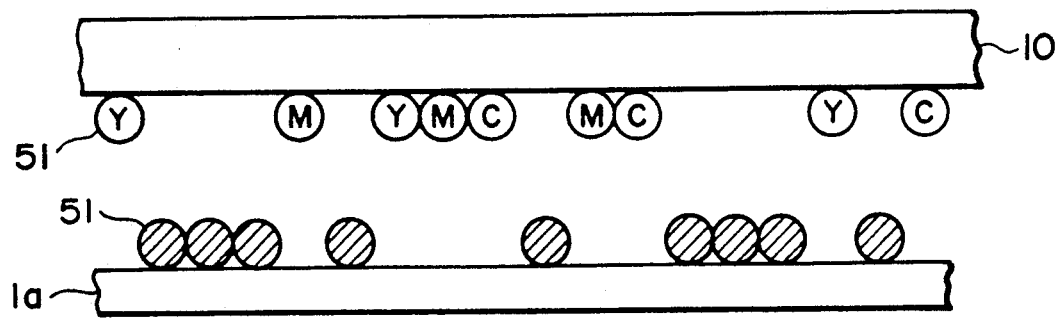

Then, as shown in FIG. 4C, while the transfer recording layer 1b is illuminated with a light beam with a wavelength λ(M), resistance heating elements 20a, 20e and 20f are caused to generate heat, whereby among the image forming elements 51 containing a magenta colorant, those applied with the heat and the light beam with a wavelength λ(M) are cured. Further, as shown in FIG. 4D, while the light flux with wavelength λ(C) is provided, desired resistance heating elements are caused to generate heat, whereby among the image forming elements 51 containing a cyan colorant, those applied with the heat and the light beam with a wavelength λ(C) are cured to finally leave a transferable image formed of non-cured image forming elements 51 in the transfer recording layer 1b. The transferable image is then transferred to a transfer-receiving medium 10 in a subsequent transfer step as shown in FIG. 4E.

In the transfer step, the transfer recording medium 1 on which the transferable image has been formed is caused to contact the transfer-receiving medium 10 through the faces, and heat is applied from the transfer recording medium side or the transfer-receiving medium 10 side, whereby the transferable image is selectively transferred to the transfer-receiving medium 10 to form a visible image thereon. Accordingly, the heating temperature in the transfer step is so determined in connection with the change in transfer characteristics that the transferable image is selectively transferred. Further, in order to effectively carry out the transfer, it is also preferred to apply a pressure simultaneously. Such application of a pressure is particularly effective in a case where a transfer-receiving medium 10 having poor surface smoothness is used.

In the above-mentioned embodiment, light energy is imparted to a transfer recording medium prior to the formation of a transferable image (i.e., in a pre-application step). It is also possible to impart both of light and heat energies to the transfer recording medium 1 in the pre-application step. In such a case, it is preferred to uniformly impart light energy or light and heat energies to the transfer recording medium (i.e., to impart these energies to the entire area thereof) in view of high-speed recording. These energies are required to be imparted so that the transfer-initiation temperature of the transfer recording layer 1b does not abruptly increase. For example, in the above-mentioned graph of FIG. 1, the period of time wherein the light and heat energies are imparted to the transfer recording medium is required to be, at most $t_1$ or shorter in the pre-application step. Accordingly, it is sufficient to impart these energies to the transfer recording medium for a period of $t_3$, which is shorter than that in a case where light energy alone is imparted thereto.

In each case where light energy alone or both light and heat energies are imparted, the period of time required for the formation of a transferable image is shortened, whereby high-speed recording can be effected with respect to the entire image forming process.

Figure 5:
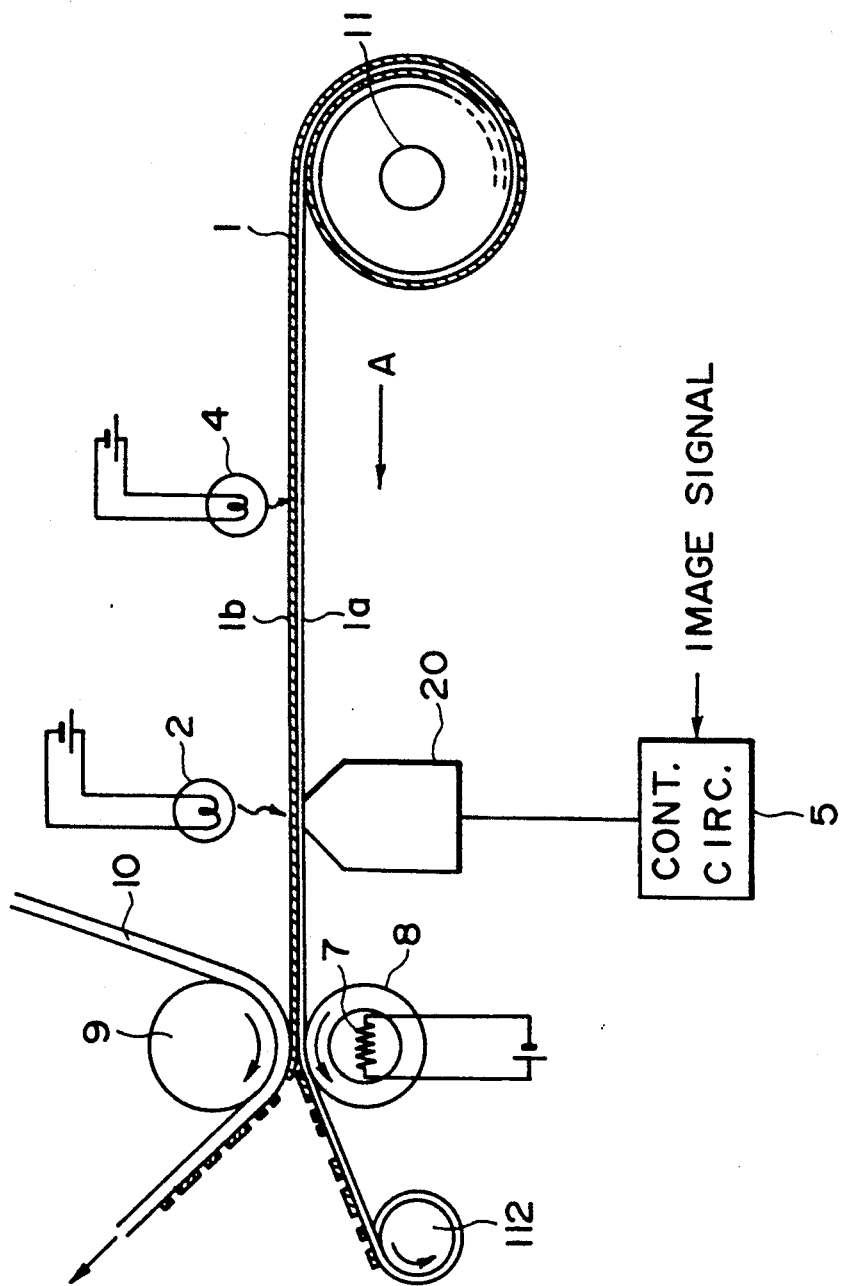
FIGS. 5, 7 and 9 are schematic side views each showing an example of a system arrangement used in the image forming methods of Examples 1, 2 and 3 appearing hereinafter.

In the above-mentioned embodiment as shown in FIG. 3 (or an embodiment as shown in FIG. 5 appearing hereinafter), light illumination prior to the transferable image formation is effected by using a light source 4 which is different from that used in the transferable image formation section (i.e., that used for forming the transferable image). However, it is possible to guide a light beam emitted from the light source 2 used in the transferable image formation section by means of a mirror (not shown), etc., so that it is imparted to a portion of the transfer recording layer disposed upstream of the transferable image formation section with respect to the moving direction of the transfer recording medium.

In the present invention, there may be used any recording medium as long as it is capable of providing a transferable image due to a physical property change based on the application of light and heat energies. For example, a transferable image can be formed by using a recording medium comprising a transfer recording layer of which physical property such as melting temperature, softening point, glass transition point and viscosity can be irreversibly changed on the basis of the application of light and heat energies.

In the recording medium used in the present invention, a transfer recording layer to be cured when provided with light and heat energies comprises, at least, a functional component and a colorant. The functional component may preferably comprise at least a photopolymerization initiator and a polymerizing component. The polymerizing component may preferably comprise a monomer, oligomer or prepolymer having an unsaturated (ethylenic) double bond. Further, the transfer recording layer may contain an optional additive such as a binder, a thermal polymerization inhibitor, a plasticizer, or a surface-smoothing agent, as desired.

The photopolymerization initiator used in the present invention may include a carbonyl compound, a halogen compound, an azo compound, an organosulfur compound. etc. More specifically, there may be used, e.g., aromatic ketones or their derivatives such as acetophenone, benzophenone, coumarin, xanthone, thioxanthone, chalcone, and styrylstyrylketone; diketones or their derivatives such as benzil, acenaphtylenequinone and camphorquinone; halogen compounds such as anthraquinonesulfonyl chloride, quinolinesulfonyl chloride, and 2,4,6-tris(trichloro-methyl)-s-triazine; etc. The photopolymerization initiator used in the present invention, however, is not restricted to these compounds.

In order to apply the image forming method according to the present invention to multi-color image formation, the above-mentioned image forming elements 51 constituting the transfer recording layer 1b are required to have sensitivities to different wavelengths depending on the colorants contained therein. More specifically, when there are a number (n) of colors of image forming elements 51, the image forming elements 51 should contain n types of functional components allotted to respective colors and each providing an abruptly changing reaction velocity when irradiated with a particular wavelength of light. These functional components (or photopolymerization initiators) in combination of n kinds are respectively contained in the image forming elements which are distributed to form a layer.

Examples of such a combination of photopolymerization initiators may include one comprising:

a photopolymerization initiator having a maximum sensitivity in a region of about 430–500 nm, such as:

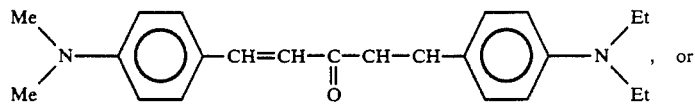

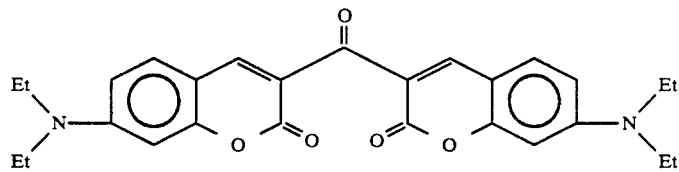

in combination with an S-triazine compound having a trihalomethyl group, a photopolymerization initiator having a maximum sensitivity in a region of about 370–400 nm, such as:

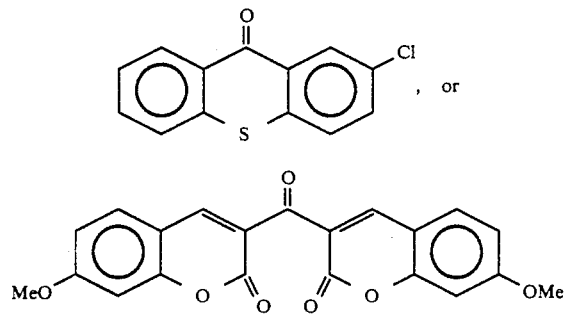

in combination with a tertiary amine compound, and a photopolymerization initiator having a maximum sensitivity in a region of about 300–350 nm, such as:

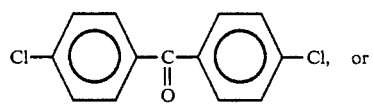

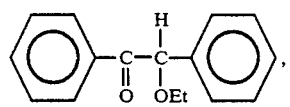

in combination with a tertiary amine compound.

Thus, the maximum sensitivities of the photopolymerization initiators are separated or differentiated from each other, whereby the image forming elements may have sensitivities to different wavelengths. Accordingly, color separation among three colors may be provided by using the above photopolymerization initiators. Further, a full-color recording system may be developed in a similar manner.

Further, in the present invention, a compound having a large absorption in a region of ultraviolet to visible wavelengths such as an ultraviolet ray-absorbing agent, may be used in combination with the photopolymerization initiator. In such a case, the spectral characteristic of the photopolymerization initiator can be enhanced by narrowing the wavelength region to which the photopolymerization initiator has a sensitivity.

The monomer, oligomer or prepolymer having an unsaturated double bond may include: urethane acrylates or urethane methacrylates synthesized by a polyaddition reaction of a polyisocyanate (optionally reacted with a polyol, as desired) with an alcohol or amine having an unsaturated double bond; epoxyacrylates synthesized by an addition reaction of an epoxy resin with acrylic acid or methacrylic acid; polyester acrylates, spiacrylates, or polyether acrylates. The monomer, oligomer or prepolymer used in the present invention, however, is not restricted to these compounds.

Further, in the present invention, there may be used a prepolymer comprising a skeleton of polyalkylene, polyether, polyester or polyurethane as a main chain, to which a polymerizing or crosslinking reactive group represented by an acrylic group, a methacrylic group, a cinnamoyl group, a cinnamylidene-acetyl group, a furylacryloyl group or a cinnamic acid ester group, is introduced as a side chain. The prepolymer used in the present invention is not restricted to these compounds.

The above monomer, oligomer or prepolymer may preferably be semisolid or solid at normal or room temperature, but may also be liquid as far as it can keep itself semisolid or solid when mixed with a binder as mentioned hereinafter. The weight ratio of (photopolymerization initiator):(polymerizing component) may preferably be 1:5 to 1:1000 more preferably 1:10 to 1:100.

The above-mentioned monomer, oligomer or prepolymer having an unsaturated double bond, and the photopolymerization initiator may be used in combination with a binder. As the binder, there may be used any organic polymer compatible with the above monomer, oligomer or prepolymer having an (ethylenic) unsaturated double bond.

Examples of such organic polymer may include: polyacrylic acid alkyl esters such as polymethyl acrylate and polyethyl acrylate; polymethacrylic acid alkyl esters such as polymethyl methacrylate and polyethyl methacrylate; methacrylic acid copolymers, acrylic acid copolymers, and maleic acid copolymers; chlorinated polyolefins such as chlorinated polyethylene and chlorinated polypropylene; polyvinyl chloride, polyvinylidene chloride, polyacrylonitrile, or copolymers comprising monomers constituting these polymers; polyvinyl alkyl ethers, polyethylene, polypropylene, polystyrene, polyamide, polyurethane, chlorinated rubber, cellulose derivatives, polyvinyl alcohol, and polyvinyl pyrrolidone. The binder used in the present invention is not restricted to these compounds. These binders may be used singly or as a mixture of two or more species in an appropriate proportion. Further, waxes may be used as the binder without considering the compatibility or incompatibility thereof.

The wt. ratio of (polymerizing component): (binder) may preferably be 1:0.05 to 1:3, more preferably 1:0.05 to 1:0.8.

The coloring component or colorant is a component to provide an optically recognizable image and may be appropriately selected from various pigments and dyes. Specific examples of the colorant include: inorganic pigments such as carbon black, lead yellow, molybdenum red, and red iron oxide; organic pigments such as Hansa Yellow, Benzidine Yellow, Brilliant Carmine 6B, Lake Red C, Permanent Red F5R, Phthalocyanine Blue, Victoria Blue Lake, and Fast Sky Blue; leuco dyes, and phthalocyanine dyes.

The colorant may preferably used in a proportion of 0.1 to 30 wt. parts based on the total amount of the binder, photopolymerization initiator, and the monomer, oligomer or prepolymer having an ethylenic unsaturated double bond.

Further, in the present invention, the transfer recording layer 1b may further comprise an optional additive such as a thermal polymerization inhibitor or a plasticizer.

When the image forming elements 51 constituting the transfer recording layer are provided in the form of microcapsules, the core of the capsules may be formed of the above-mentioned materials for the transfer recording layer. On the other hand, the wall of the microcapsules may for example be formed of a material including gelatin, gum arabic; cellulosic resins such as ethyl cellulose, and nitrocellulose; polymers such as urea-formaldehyde resin, polyamides, polyesters, polyurethane, polycarbonate, maleic anhydride copolymers, polyvinylidene chloride, polyvinyl chloride, polyethylene, polystyrene, and polyethylene terephthalate (PET).

The transfer recording layer may preferably be formed in a thickness of 1–20 microns, particularly 1–10 microns. It is preferred that the image forming elements including those in the form of microcapsules particularly 3–10 microns. The image forming elements may preferably have a particle size distribution in the range of within ±50 %, particularly within ±20 %, from the number-average particle size thereof. In case where the image forming elements are in the form of microcapsules, the shell thickness may preferably be 0.1–2.0 microns, particularly 0.1–0.5 micron.

Microencapsulation may be effected in any of the known methods, such as simple coacervation, complex coacervation, interfacial polymerization, in-situ polymerization, interfacial precipitation, phase separation, spray drying, gaseous-phase suspension coating, and mechano-chemical process.

The substrates or support 1a to be used in the recording medium according to the present invention may be polyester, polycarbonate, triacetylcellulose, nylon, polyimide, polyethylene terephthalate, or metal such as aluminum, etc. The form of the substrate may be a film or sheet, plate, drum, or sphere, depending on an intended use. The substrate in the form of a film may preferably have a thickness of about 1–30 microns, more preferably about 3–15 microns.

The recording medium used in the present invention may for example be produced in the following manner.

A functional component (a photopolymerization initiator and a polymerizing component), a colorant etc., may be melt-mixed and applied onto a substrate 1a by means of an application, etc., thereby to form a transfer recording layer 1b.

In a case where the transfer recording layer 1b comprises a distributed layer of image forming elements 51, there may be used, e.g., a method wherein image forming elements 51 are mixed with an adhesive such as polyvinyl alcohol (PVA), polyacrylamide and latex, and the resultant mixture is applied onto a substrate 1a; and a method wherein an adhesive such as epoxy adhesive, urethane adhesive, acrylic adhesive, polyester adhesive and ethylene-vinyl acetate copolymer is applied onto a substrate 1a and image forming elements 51 are distributed or sprinkled on the resultant adhesive coating to be bonded to the substrate 1a.

Hereinbelow, the present invention will be described in more detail by way of examples.

Example 1

TABLE 1

| Item | Compound | wt. % |
|---|---|---|
| Polymerizable monomer | $(CH_2=CHCOOCH_2CH_2-O-CONH-\langle H \rangle_{\overline{n}} CH_2)$ | 68 |
| Photo-initiator | Irgacure 184 (mfd. by Ciba-Geigy Corp.) | 2 |
|  | Ethyl p-dimethylaminobenzoate | 2 |
| Binder | Polymethyl methacrylate (Elvasite 2041, mfd. by Du Pont) | 23 |
| Colorant | Sumiton Carmine (mfd. by Sumitomo Kasei Kogyo K.K.) | 5 |

The components shown in Table 1 were mixed and dissolved in chloroform (solvent) and applied onto a 6 microns-thick PET film substrate 1a by means of an applicator and dried to form an about 5 micron-thick transfer recording layer 1b, whereby a transfer recording medium 1 according to the present invention was prepared. The recording medium 1 was wound up in a roll and set in an apparatus as shown in the schematic sectional view of FIG. 5 taken in the thickness direction of the recording medium.

The thermal head 20 disposed in the transferable image formation sections of the apparatus was one of a line type of 8 dots/mm—A4 size having a row of resistance heating elements at its edge portion. The thermal head 20 was disposed so as to contact the substrate 1a side of the recording medium 1 and in such a manner that the recording medium 1 was pressed to the heating elements due to a tension applied to the recording medium 1. Opposite to the thermal head 20 by the medium of the recording medium 1, a health ray fluorescent lamp 2 having a peak wavelength of 313 nm was disposed.

At a position upstream of the above-mentioned transferable image formation section (where the light source 2 and thermal head were disposed opposite to each other) with respect to the moving direction of the recording medium 1, there was disposed a fluorescent lamp 4 for applying light to the transfer recording layer 1b. The fluorescent lamp 4 used herein was the same as the above-mentioned fluorescent lamp 2.

In image formation, while effecting uniform illumination with the fluorescent lamp 4 for pre-application (or pre-exposure), the thermal head 20 and the fluorescent lamp 2 for image formation were driven according to the following timing in phase with which the transfer recording medium 1 was conveyed by means of a stepping motor and a driving roller (not shown) at a speed of 1.25 mm/sec in the direction of an arrow A. More specifically, the resistance heating elements of the thermal head 20 were energized at a current energy of 0.5 W/dot×30 msec under control based on image signals at a repetition cycle of 100 msec/line. The fluorescent lamp 2 in the transferable image formation section was turned on simultaneously with the initiation of the current application to the resistance heating elements of the thermal head 20, and turned off 40 msec after the turning-on. In such a manner, a transferable image was formed in the transfer recording layer 1b according to the image signal.

In the subsequent transfer step, the recording medium 1 wherein the transferable image had been formed was superposed onto a transfer-receiving paper 10 of plain paper so that the transfer recording layer 1b contacted the paper 10. The resultant laminate was conveyed by means of a transfer roller 8 and a pressure roller 9 disposed opposite to the transfer roller 8, and thereafter the recording medium 1 was peeled from the transfer-receiving paper 10. The surface temperature of the transfer roller 8 used herein was controlled at about 100° C. by means of a heater 7 disposed therein.

As a result, a good transferred image having a magenta color was obtained on the transfer-receiving paper 10.

COMPARATIVE EXAMPLE 1

Image formation was effected in the same manner as in Example 1 except that the fluorescent lamp 4 for pre-exposure (or pre-image formation exposure) used in Example 1 was not turned on. As a result, only an unclear image having fog in the background thereof was provided on the transfer-receiving paper 10.

On the other hand, while the fluorescent lamp 4 for pre-exposure was left turning off, image formation was effected in the above-mentioned manner except that the current energy applied to the thermal head 20 was increased to 0.5 W/dot×50 msec, the illumination time of the fluorescent lamp 2 used in the image formation section was extended to 60 msec and the repetition cycle was 120 msec/line. As a result, a good image which was the same as in Example 1 was obtained.

Example 1

TABLE 2

| Item | Component | wt. % |
|---|---|---|
| Polymerizable monomer | 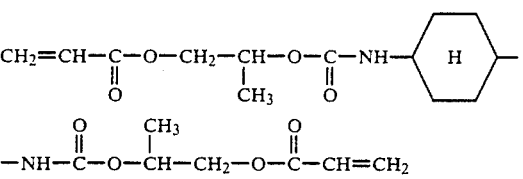 | 65 |
| Photopolymerization initiator | 4,4'-Dimethoxybenzil/Ethyl p-dimethylaminobenzoate | 5.2/0.4 |
| Binder | Polymethyl methacrylate (Elvasite 2041, mfd. bu Du Pont) | 23.4 |
| Colorant | PV Fast Pink E-01 (mfd. by Hoechst) | 6 |

TABLE 3

| Item | Component | wt. % |
|---|---|---|
| Polymerizable monomer | 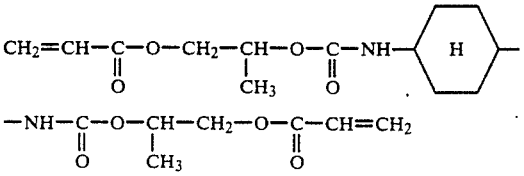 | 65 |
| Photopolymerization initiator | 2-Chlorothioxanthone/Ethyl p-dimethylaminobenzoate | 5.2/1.3 |
| Binder | Polymethyl methacrylate (Elvasite 2041, mfd. by Du Pont) | 22.5 |
| Colorant | Cyanine Blue 3472 (mfd. by Dainichi Seika K.K.) | 6 |

TABLE 4

| Item | Component | wt. % |
|---|---|---|
| Polymerizable monomer | 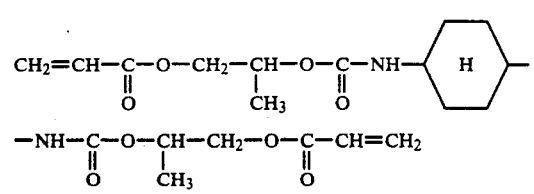 | 71 |
| Photopolymerization initiator | 3,3'-Carbonylbis(7-diethyaminocoumarin) | 1.4 |
| | Camphorquinone | 1.4 |
| | Ethyl p-dimethyaminobenzoate | 1.4 |
| Binder | Polymethyl methacrylate (Elvasite 2041, mfd. by Du Pont) | 24.3 |
| Colorant | PV Fast Yellow HG (mfd. by Hoechst) | 0.5 |

Image forming elements in a microcapsular form were prepared by using the components shown in the above Tables 2, 3 and 4 in the following manner.

10 g of a mixture of components shown in Table 2 was mixed with 20 g of methylene chloride. The resultant mixture was further mixed with a solution obtained by dissolving a few drops of nonionic surfactant having an HLB of at least 10 (Nonipole 100, HLB=13, mfd. by Sanyo Kasei Kogyo K.K.) and 1 g of gelatin in 200 ml of water, and the mixture was further emulsified by means of a homomixer at 8000–10000 rpm, on heating at 60° C., thereby to obtain oil droplets having an average particle size of 26 microns. The mixture was further stirred for 30 min. at 60° C., and then the methylene chloride was distilled off thereby to obtain oil droplets having an average particle size of 10 microns.

Then, a solution obtained by dissolving 1 g of gum arabic in 20 ml of water was added to the above prepared mixture. An NH$_4$OH (aqueous ammonia solution) was added to the resultant mixture, while cooled slowly to 5° C., to adjust the pH to 11 or higher, whereby a microcapsule slurry was prepared. Thereafter, 1.0 ml of a 20 % aqueous glutaraldehyde solution was slowly added to the slurry at 5° C. thereby to harden the microcapsule walls.

The slurry was subjected to solid-liquid separation by means of a Nutsche funnel, and the solid was dried at 35° C. for 10 hours in a vacuum drier to obtain microcapsular image forming elements 51.

The above procedure was repeated except that 10 g of a mixture of components shown in Table 3 and 10 g of a mixture of components shown in Table 4 were used instead of those shown in Table 1, respectively.

The thus obtained three species of the image forming elements 51 were microcapsules having a particle size of about 8-12 microns.

Figure 6:
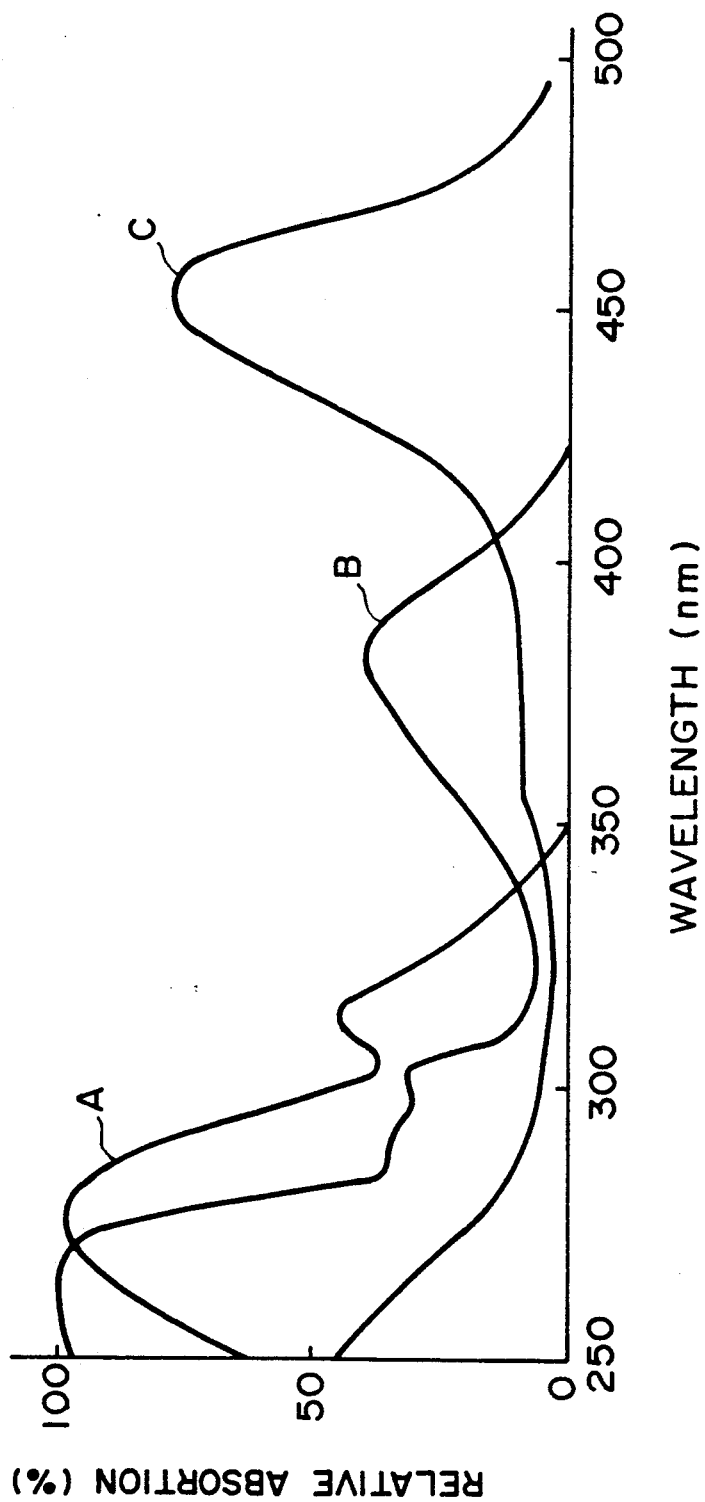
FIG. 6 is a graph showing an absorption characteristic of a photo-initiator usable in the recording medium according to the present invention.

The photopolymerization initiator shown in Table 2 had a property of initiating a reaction when it absorbed light having a wavelength region corresponding to a graph A shown in FIG. 6. The photo-polymerization initiator shown in Table 3 or 4 had a property of initiating a reaction when it absorbed light having a wavelength region corresponding to a graph B or C shown in FIG. 6, respectively. The above-mentioned three species of image forming elements had colors of magenta (Table 2), cyan (Table 3) and yellow (Table 4), respectively.

By using a mixture obtained by mixing equal amounts of the thus prepared three species of image forming elements, a recording medium 1 to be used in the present invention was prepared in the following manner.

First, a solution of a polyester adhesive (Polyester LP-011, mfd. by Nihon Gosei Kagaku K.K.) in toluene was applied onto a substrate of a PET film having a thickness of 6 microns, and then dried thereby to form an adhesive layer having a thickness of about 1 micron. The PET film side of the thus coated film was caused to closely contact a hot plate heated up to about 100° C., and an excess amount of the above-mentioned mixture comprising the three species of image forming elements was sprinkled on the adhesive layer, and thereafter the PET film was peeled from the hot plate. Then, image forming elements not contacting the adhesive layer were removed by means of an air gun, and thereafter the PET film on which the image forming elements were disposed was passed between two rollers rotating at a speed of 3 rpm and contacting each other under a pressure of 1 Kgf/cm$^2$, whereby the image forming elements were caused to closely contact the PET film. The surface temperature of one of the rollers contacting the PET film side was kept at 110° C.

Figure 7:
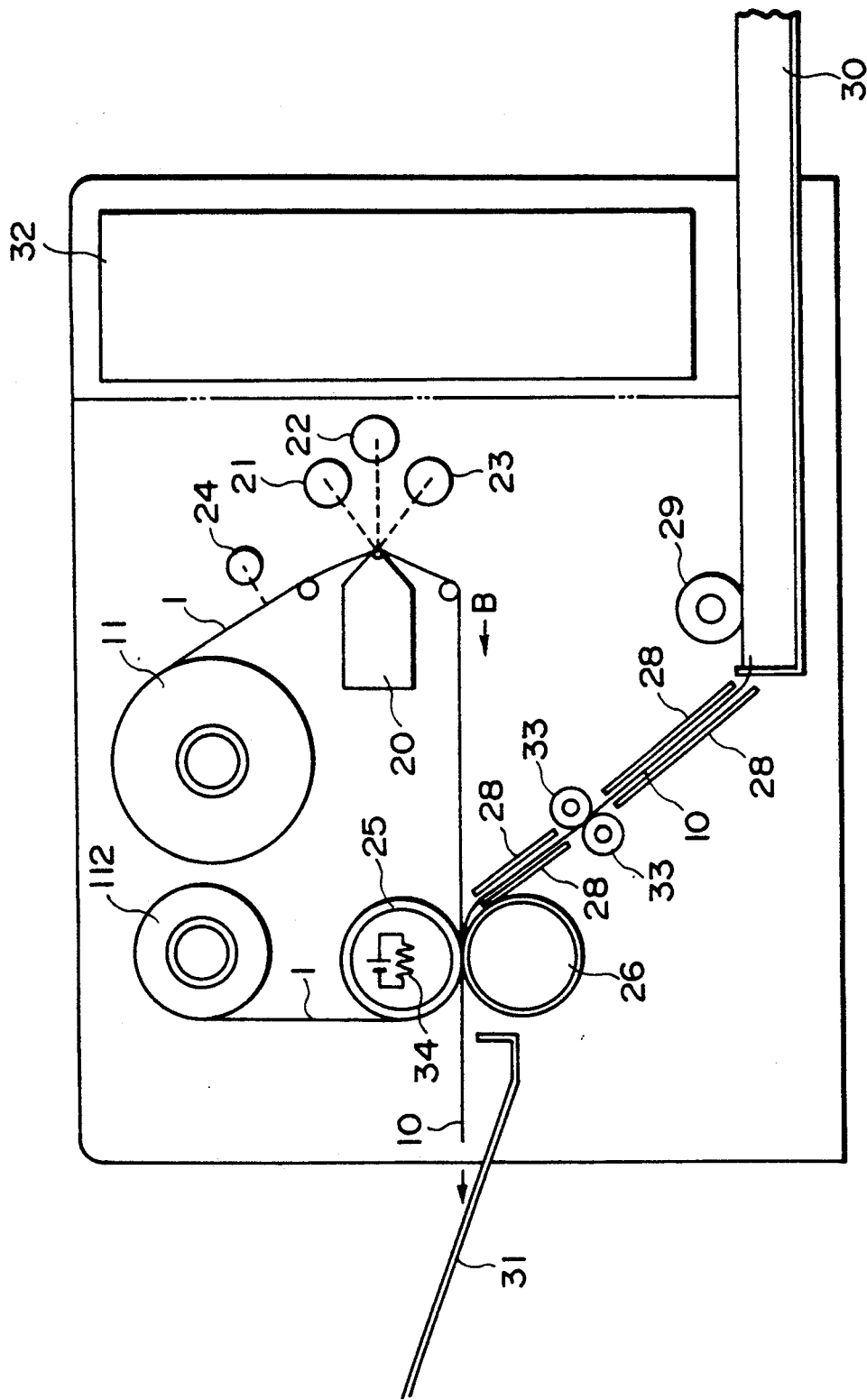

The thus obtained recording medium 1 was wound up in a roll and set in an apparatus as shown in FIG. 7 so that the PET film side of the recording medium 1 contacted a thermal head 20.

In this instance, the light source included a 20W-health ray fluorescent lamp 21 (FL20SE, mfd. by Toshiba K.K.) having a peak wavelength of 335 nm, a 20W-fluorescent lamp 22 having a peak wavelength of 390 nm (FL10A70E 39, mfd. by Toshiba K.K.), The thermal head 20 used herein was the same that used in Example 1 and a 20W-fluorescent lamp 23 having a peak wavelength of 450 nm (FL10A70B, mfd. by Toshiba K.K.). When the thermal head 20 was energized, a current pulse corresponding to 0.5 W/dot was applied thereto at a duty of 33.3 % for 20 msec.

Referring to FIG. 7, the recording medium 1 was fed from a feed roll 11 and was wound around a wind-up roll 112, and a recording paper 24 of plain paper was fed from a recording paper cassette 30 to a transfer section comprising a transfer roller 25 and a pressure roller 26. The apparatus shown in FIG. 7 was driven and controlled by a control unit 32.

In this instance, a fluorescent lamp 24 for effecting light illumination prior to transferable image formation was disposed upstream of a transferable image formation section where the thermal head 20 was disposed opposite to the fluorescent lamp 21, etc., with respect to the moving direction of the recording medium 1. The fluorescent lamp 24 was one using a mixture of the fluorescent substances respectively used in the above-mentioned fluorescent lamps 21, 22 and 23 in the transferable image formation section. Accordingly, the fluorescent lamp 24 had three species of peak wavelengths of 335 nm, 390 nm, and 450 nm.

By using the above-mentioned apparatus shown in FIG. 7, image formation was effected in the following manner.

Figure 8:
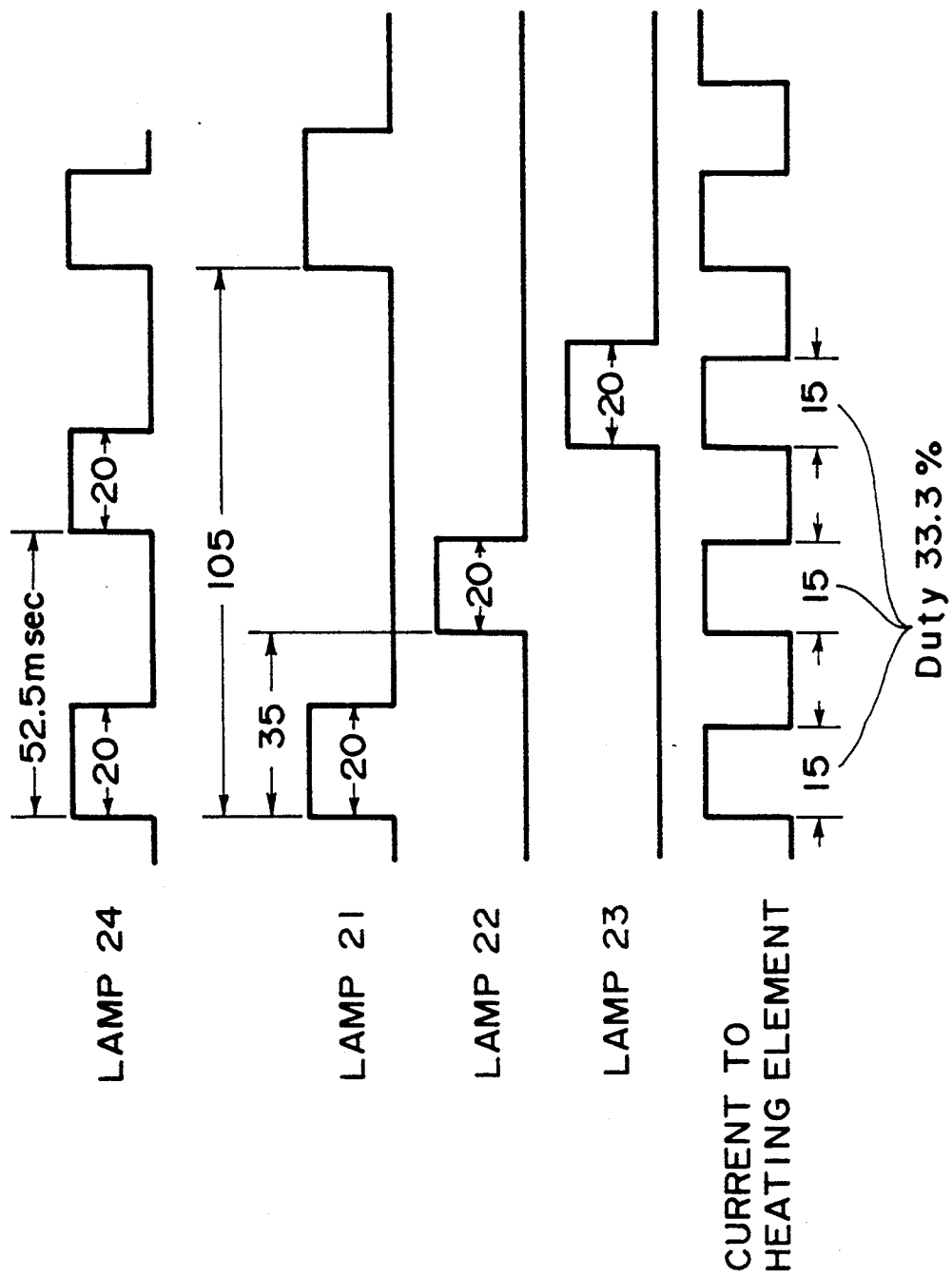
FIGS. 8 and 10 are timing charts for driving respective energy sources used in the recording methods of Examples 2 and 3, respectively, appearing hereinafter.

First, as shown in a timing chart of FIG. 8, the fluorescent lamp 24 for pre-exposure was turned on for 20 msec, and thereafter turned off for 32.5 msec. In other words, the fluorescent lamp 24 was blinked on and off in a repetition cycle of 52.5 msec.

Then, in the transferable image formation section, a current was supplied for 15 msec to the thermal head 20 corresponding to an image signal of "cyan" while the fluorescent lamp 21 was simultaneously turned on to effect uniform illumination. The illumination time was 20 msec as shown in FIG. 8. After 15 msec from the termination of the illumination, a current was supplied to the thermal head 20 corresponding to an image signal of "magenta", while the fluorescent lamp 22 was simultaneously turned on to effect uniform illumination. The energization time and the illumination time were the same as those in the case of "cyan" signal. Such energization and illumination were effected corresponding to a "yellow" signal in the same manner as described above.

In the above described manner, the thermal head 20 was energized under control based on image signals of cyan, magenta and yellow, while the recording medium 1 was conveyed in the direction of an arrow B at a speed of 1.19 mm/sec by the transfer roller 25 and a stepping motor (not shown) in synchronism with the operation in a repetition cycle of 105 msec/line. After a transferable image was formed in this way, a transfer-receiving paper 10 which had been supplied from the recording paper cassette 30 by means of a paper-feeding roller 29 and a pair of conveying rollers 33, was superposed onto the transferable image-bearing face of the recording medium 1. The resultant laminate was conveyed to a contact position where the transfer roller 25 and the pressure roller 26 were disposed opposite to each other under pressure. The transfer roller 25 was an aluminum roller of which surface temperature was controlled at 120° C. by means of a heater 34 disposed inside thereof. Further, the pressure roller 26 was an aluminum roller covered with a silicone rubber. The transfer roller 25 and the pressure roller 26 were controlled to exert a pressure of 25 Kgf/cm².

When the laminate of the recording medium 1 and the transfer-receiving paper 10 was passed through the two rollers 25 and 26, a multi-color transferable image formed on the recording medium 1 was transferred to the transfer-receiving paper 10, and the resultant paper 10 on which a transferred image was formed was discharged into a discharge tray 31.

The thus obtained multi-color image on the transfer-receiving paper 10 was free of color deviation, had a high degree of saturation and clearness, and was a clear image of good quality showing good fixing characteristic.

<COMPARATIVE EXAMPLE 2

Image formation was effected in the same manner as in Example 2 except that the fluorescent lamp 24 for pre-exposure used in Example 1 was not turned on. As a result, only an image having fog in the background thereof was provided on the transfer-receiving paper 10. Further, the resultant image portion did not show a desired color but showed a turbid color.

On the other hand, while the fluorescent lamp 24 for pre-exposure was left turning off, image formation was effected in the above-mentioned manner except that the energization time for the thermal head 20 was increased to 20 msec, the illumination time of the fluorescent lamps 21, 22 and 23 used in the image formation section was extended to 30 msec and the repetition cycle was 120 msec/line. As a result, an image which was the same as in Example 2 was obtained.

EXAMPLE 3

Figure 9:
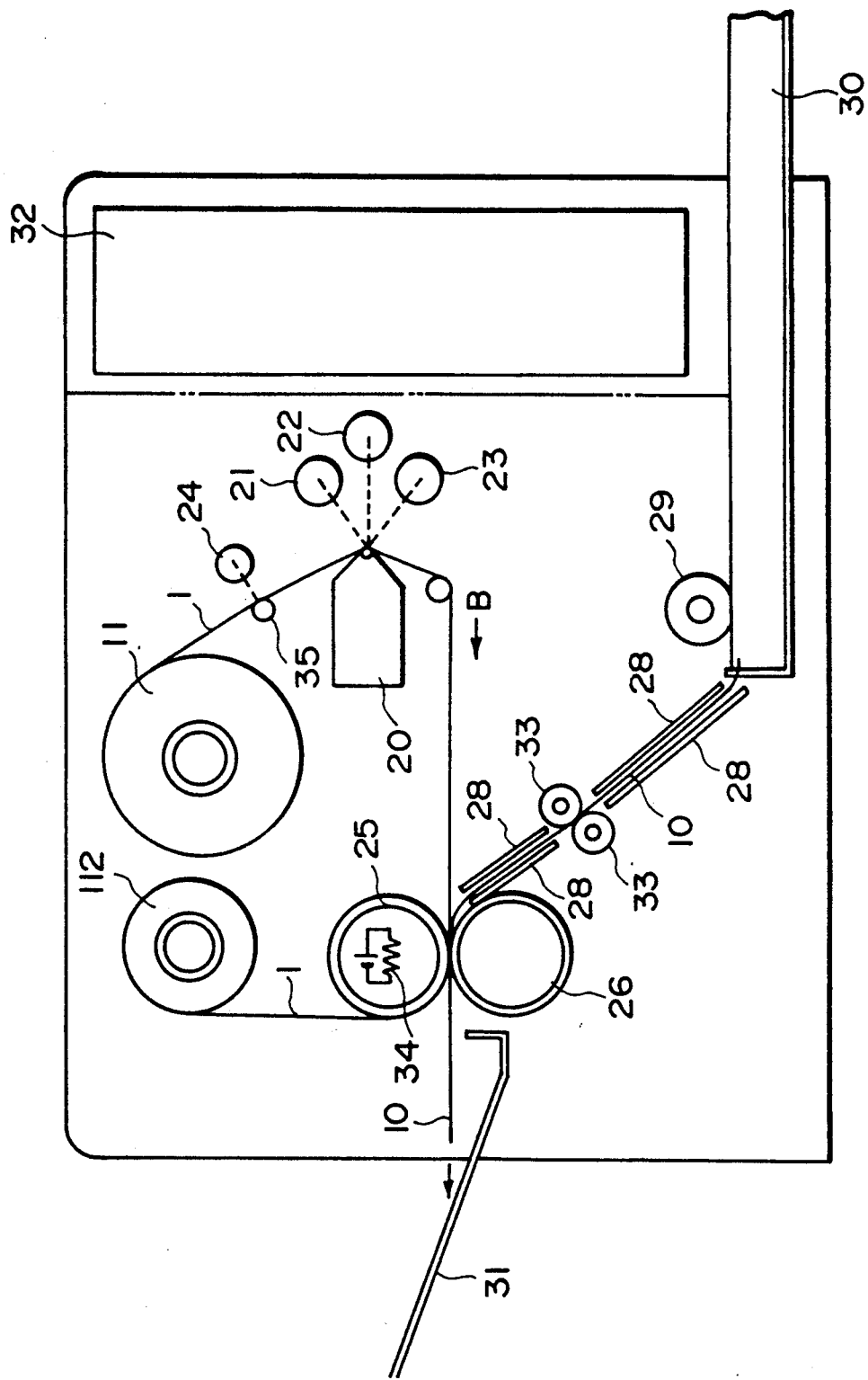

A recording medium was prepared in the same manner as in Example 2 and loaded in an image-forming apparatus as shown in FIG. 9. The apparatus shown in FIG. 9 was the same as that shown in FIG. 7, except that a heating bar 35 for pre-heating was disposed opposite to the fluorescent lamp 24 by the medium of the recording medium 1. The heating bar 35 had a width of about 1 mm with respect to the moving direction of the recording medium 1, and was controlled so that its surface temperature was 120° C.

Figure 10:
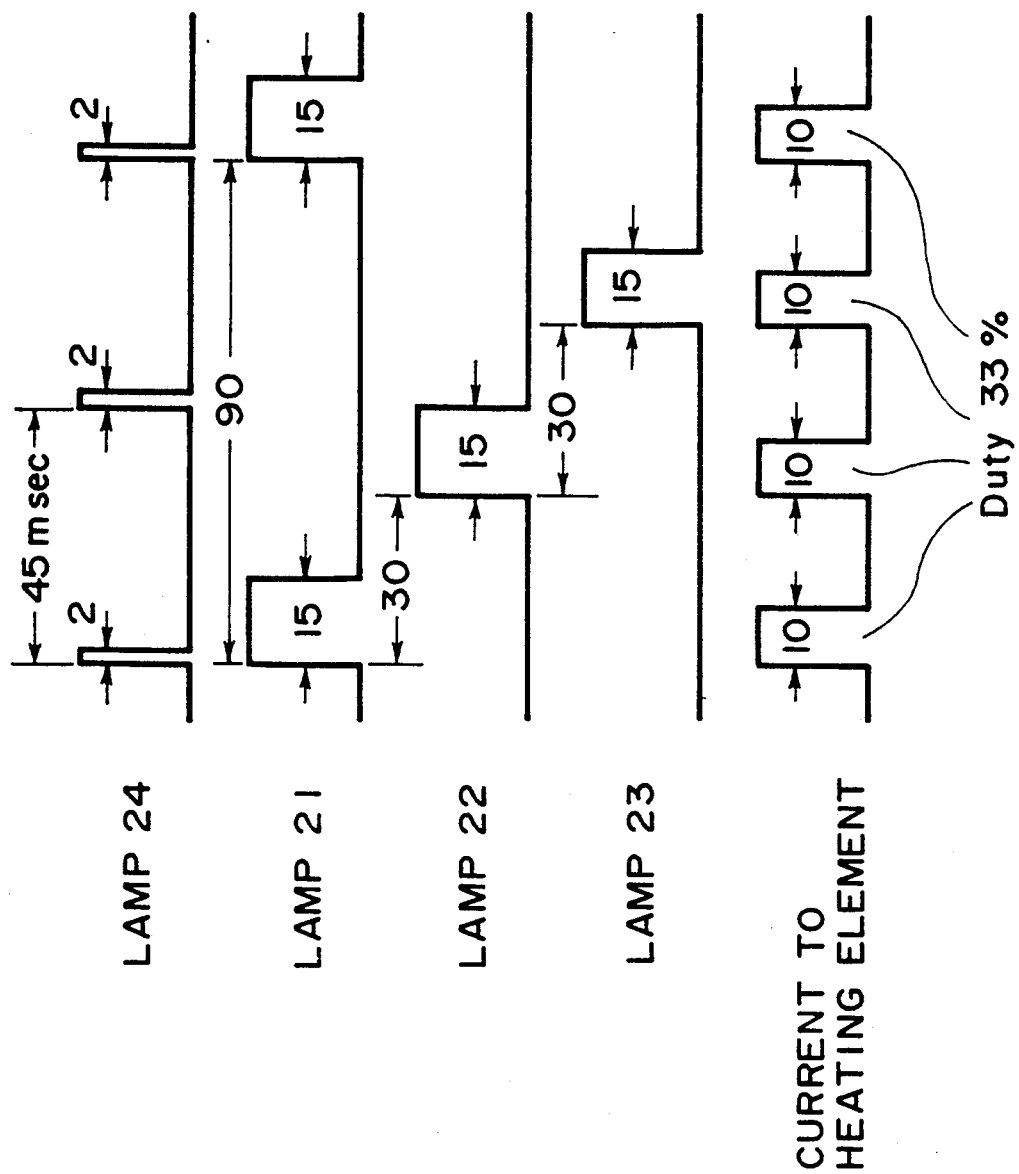

By using the apparatus shown in FIG. 9, image formation was effected according to a timing chart of FIG. 10 in a repetition cycle of 90 msec/line. As a result, a multi-color image similar to that obtained in Example 2 was obtained on the transfer-receiving paper 10.

As described hereinabove, in the image forming method according to the present invention, a transfer recording layer of a recording medium is caused to react to a prescribed extent prior to the formation of a transferable image, whereby the period of time for application of light and heat energies required for the transferable image formation was shortened. As a result, process time for the completion of the entire process is reduced (i.e., the process speed is accelerated as a whole).

In an embodiment of the present invention wherein only light energy is used prior to the transferable image formation, not only the time for energy application for the transferable image formation is shortened but also thermal energy consumption is reduced with respect to the entire process. As a result, not only the above-mentioned acceleration in the process speed, but also the saving of energy is attained.

What is claimed is:

1. An image-forming method comprising:
   providing a recording medium comprising a substrate and a transfer recording layer disposed thereon; said transfer recording layer comprising a colorant and a functional component and being capable of changing its transfer characteristic when provided with light and heat energies, said functional component comprising a photopolymerization initiator and a polymerizing component;
   imparting heat energy to the transfer recording layer and imparting light energy to the transfer recording layer at an elevated temperature under such a condition that at least one of the light and heat energies corresponds to a recording information signal, thereby to form a transferable image in transfer recording layer; and
   transferring the transferable image in the transfer recording layer to a transfer-receiving medium, thereby to form thereon an image corresponding to the transferable image;

wherein at least light energy is imparted non-imagewise to the transfer recording layer prior to the formation of the transferable image.

2. A method according claim 1, wherein the quantity of the energy imparted to the transfer recording layer prior to the transferable image formation is 0.1 to 0.8 times that required for increasing the transfer-initiation temperature of the transfer recording layer to 150° C.

3. A method according to claim 2, wherein the ratio (C/B) between the quantity of the energy imparted to the transfer recording layer prior to the transferable image formation (B joule) and the quantity of the energy imparted thereto for the transferable image formation (C joule) is 0.3 to 2.0.

4. A method according to claim 1, wherein the quantity of the energy imparted to the transfer recording layer prior to the transferable image formation is 0.2 to 0.8 times that required for increasing the transfer-initiation temperature of the transfer recording layer to 150° C.

5. A method according to claim 4, wherein the ratio (C/B) between the quantity of the energy imparted to the transfer recording layer prior to the transferable image formation (B joule) and the quantity of the energy imparted thereto for the transferable image formation (C joule) is 0.3 to 2.0.

6. A method according to claim 1, wherein said transfer recording layer is capable of decreasing its transferability when provided with light and heat energies.

7. A method according to claim 1, wherein said transfer recording layer comprises a distributed layer of image-forming elements.

8. A method according to claim 7, wherein said image-forming element comprises a microcapsule.

9. A method according to claim 1, wherein said transfer recording layer comprises a distributed layer comprising plural species of image forming elements, each of which has any one coloring characteristic selected from prescribed plural species thereof, and light energies having different wavelengths corresponding to the coloring characteristics of the image forming elements are sequentially imparted to the transfer recording layer to form said transferable image.

10. A method according to claim 9, wherein light energies having different wavelengths corresponding to the coloring characteristics of the image forming elements are sequentially imparted to the transfer recording layer prior to the formation of said transferable image.

11. A method according to claim 10, wherein heat energy is imparted to the transfer recording layer together with said light energy, prior to the formation of said transferable image.

12. A method according to claim 9, wherein light energies having different wavelengths corresponding to the coloring characteristics of the image forming elements are simultaneously imparted to the transfer recording layer, prior to the formation of said transferable image.

13. A method according to claim 12, wherein heat energy is imparted to the transfer recording layer together with said light energy, prior to the formation of said transferable image.

* * * * *

UNITED STATES PATENT AND TRADEMARK OFFICE
CERTIFICATE OF CORRECTION

PATENT NO. : 5,028,579
DATED : July 2, 1991
INVENTOR(S) : Toshiharu Inui, et al.                Page 1 of 5

It is certified that error appears in the above-indentified patent and that said Letters Patent is hereby corrected as shown below:

On the title page:

Item:[56] REFERENCES CITED

```
    FOREIGN PATENT DOCUMENTS,
        "18979  8/1959    should      --18979  12/1962
         9672  11/1959    read         9672    6/1963
         8436   7/1961"                8436    5/1964--.
IN THE DRAWINGS:
SHEET 1 OF 10
```

Figure 1 should read as follows:

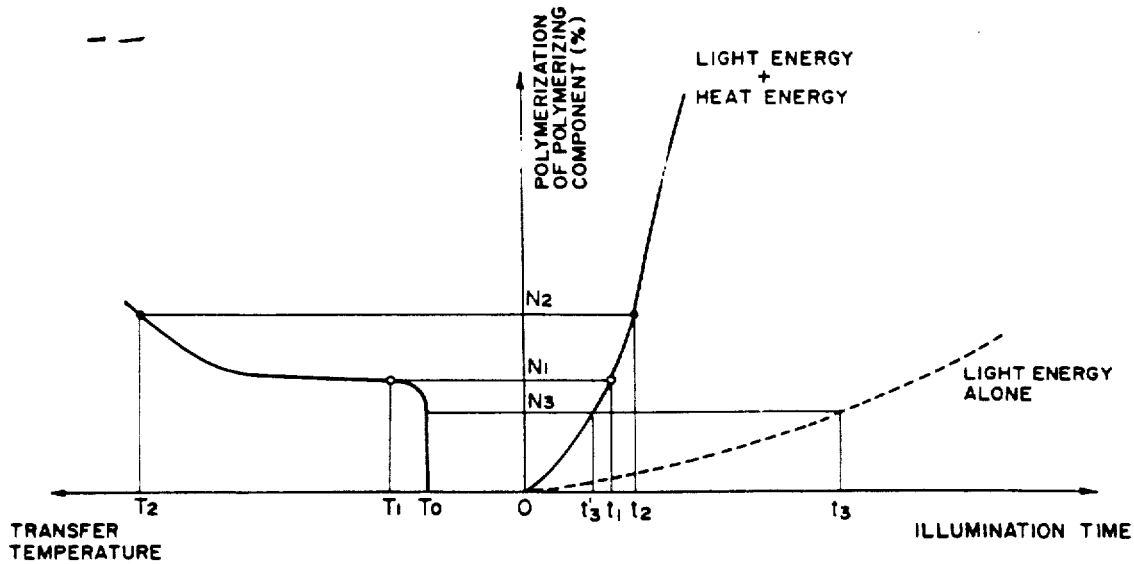

FIG. 1

UNITED STATES PATENT AND TRADEMARK OFFICE
CERTIFICATE OF CORRECTION

PATENT NO. : 5,028,579

DATED : July 2, 1991

INVENTOR(S) : TOSHIHARU INUI, ET AL.

It is certified that error appears in the above-identified patent and that said Letters Patent is hereby corrected as shown below:

SHEET 6 OF 10

FIG. 6, "ABSORTION" should read --ABSORPTION--.

COLUMN 1

Line 21, "different" should read --difference--.
    Line 43, "and" should be deleted.

COLUMN 2

Line 58, "No. 4,399,209;" should read --Nos. 4,399,209--.

COLUMN 3

Line 7, "attended with" should be deleted.
    Line 43, "apparatus" should read --apparatuses--.

COLUMN 4

Line 12, "providing" should read --¶ providing--.
    Line 49, "DRAWINGS:" should read --DRAWINGS--.
    Line 53, "view" should read --views--.

COLUMN 5

Line 29, "lines" should read --line--.

COLUMN 6

Line 23, "shown" should read --as shown--.
    Line 60, "only" should read --when only--.

UNITED STATES PATENT AND TRADEMARK OFFICE
CERTIFICATE OF CORRECTION

PATENT NO. : 5,028,579
DATED : July 2, 1991
INVENTOR(S) : TOSHIHARU INUI, ET AL.

It is certified that error appears in the above-identified patent and that said Letters Patent is hereby corrected as shown below:

COLUMN 7

Line 50, "the" (first occurrence) should read --be--.
    Line 59, "small (C/B)" should read --small. If the ratio (C/B)--.

COLUMN 8

Line 52, "lease" should read --least--.
    Line 57, "is" should read --are--.

COLUMN 9

Line 9, "20b" (second occurrence) should read --20d--.
    Line 10, "generated" should read --generate--.
    Line 11, "element 51" should read --elements 51--.

COLUMN 10

Line 25, "property" should read --properties--.
    Lines 43-44, "compound." should read --compound,--.
    Line 63, "and" should read --,--.

COLUMN 13

Line 57, "microcapsules" should read --microcapsules have an average particle size of 1-20 microns,--.

COLUMN 14

Line 34, "Example 1" should read --EXAMPLE 1--.

UNITED STATES PATENT AND TRADEMARK OFFICE
CERTIFICATE OF CORRECTION

PATENT NO. : 5,028,579
DATED : July 2, 1991
INVENTOR(S) : TOSHIHARU INUI, ET AL.

It is certified that error appears in the above-identified patent and that said Letters Patent is hereby corrected as shown below:

COLUMN 16

Line 22, "turning" should read --turned--.
    Line 30, "Example 1" should read --EXAMPLE 2--.

COLUMN 17

Line 37, "while" should read --then--.
    Line 50, "Table 1," should read --Table 2,--.
    Line 57, "photo-polymerization" should read --photopolymerization--.

COLUMN 18

Line 46, "K.K.)," should read --K.K.).--.
    Line 47, "same" should read --same as--.
    Line 48, "and" should read --along with--.
    Line 55, "paper 24" should read --paper 10--.

COLUMN 19

Line 63, "<COMPARATIVE" should read --COMPARATIVE--.
    Line 65, "lamp 24" should read --lamp 4--.

COLUMN 20

Line 4, "turning" should read --turned--.

UNITED STATES PATENT AND TRADEMARK OFFICE
CERTIFICATE OF CORRECTION

PATENT NO. : 5,028,579
DATED : July 2, 1991
INVENTOR(S) : TOSHIHARU INUI, ET AL.

It is certified that error appears in the above-identified patent and that said Letters Patent is hereby corrected as shown below:

COLUMN 20

Line 63, "in" should read --in the--.

Signed and Sealed this

Seventh Day of June, 1994

BRUCE LEHMAN

*Attest:*

*Attesting Officer*  Commissioner of Patents and Trademarks